US009354379B2

(12) United States Patent
Maeda et al.

(10) Patent No.: US 9,354,379 B2
(45) Date of Patent: May 31, 2016

(54) LIGHT GUIDE BASED OPTICAL SYSTEM FOR LASER LINE GENERATOR

(71) Applicant: Palo Alto Research Center Incorporated, Palo Alto, CA (US)

(72) Inventors: Patrick Y. Maeda, San Jose, CA (US); Timothy David Stowe, Alameda, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/500,902

(22) Filed: Sep. 29, 2014

(65) Prior Publication Data

US 2016/0091647 A1  Mar. 31, 2016

(51) Int. Cl.
*F21V 8/00* (2006.01)
*G02B 23/02* (2006.01)
*H01S 5/40* (2006.01)

(52) U.S. Cl.
CPC .............. *G02B 6/005* (2013.01); *G02B 6/0068* (2013.01); *G02B 23/02* (2013.01); *H01S 5/4025* (2013.01)

(58) Field of Classification Search
CPC ............ G03H 1/08; G03B 27/54; G02B 6/42; G02B 6/005; G02B 6/0068; G02B 23/02
See application file for complete search history.

(56) References Cited

U.S. PATENT DOCUMENTS

| | | |
|---|---|---|
| 3,800,699 A | 4/1974 | Carley |
| 5,041,851 A | 8/1991 | Nelson |
| 5,101,236 A | 3/1992 | Nelson et al. |
| 5,105,207 A | 4/1992 | Nelson |
| 5,105,369 A | 4/1992 | Nelson |
| 5,151,718 A | 9/1992 | Nelson |
| 5,500,670 A | 3/1996 | Ang et al. |
| 5,563,398 A | 10/1996 | Sampsell |
| 5,719,682 A | 2/1998 | Venkateswar |
| 5,721,622 A | 2/1998 | Venkateswar |
| 5,737,096 A | 4/1998 | Takeuchi et al. |
| 5,754,217 A | 5/1998 | Allen |
| 5,953,152 A | 9/1999 | Hewlett |
| 5,954,424 A | 9/1999 | Anderson et al. |

(Continued)

FOREIGN PATENT DOCUMENTS

| | | |
|---|---|---|
| EP | 0957384 A2 | 11/1999 |
| EP | 1155865 A2 | 11/2001 |

(Continued)

*Primary Examiner* — Sarah Al Hashimi
(74) *Attorney, Agent, or Firm* — Bever, Hoffman & Harms, LLP

(57) ABSTRACT

A laser line generator system that utilizes a light guide element to convert high energy coherent light generated by a high fill-factor laser diode bar into homogenous light, and utilizes one or more slow-axis relay lenses to image the homogenous light such that it forms a homogenous line illumination pattern on an illumination plane. The light guide utilizes parallel or down-tapered side walls to mix received coherent light in the slow-axis direction by way of total internal reflection. A Keplerian telescope including two cylinder lenses is optionally used in place of the slow-axis relay lens. Optional fast-axis lenses are used to assist in focusing the homogenous light at the illumination plane. The laser light generator forms, e.g., a single-pass imaging system for a scanning/printing apparatus in which the homogenous line illumination pattern is directed onto a linearly arranged series of spatial light modulators, such as Digital Micromirror Devices (DMDs).

20 Claims, 9 Drawing Sheets

(56) References Cited

U.S. PATENT DOCUMENTS

| | | |
|---|---|---|
| 5,997,150 A | 12/1999 | Anderson |
| 6,121,984 A | 9/2000 | Anderson |
| 6,529,261 B2 | 3/2003 | Shinada |
| 6,567,217 B1 | 5/2003 | Kowarz et al. |
| 6,606,739 B2 | 8/2003 | Kanatake et al. |
| 6,724,546 B2 | 4/2004 | Nishimae et al. |
| 7,048,388 B2 | 5/2006 | Takaura et al. |
| 7,154,640 B2 | 12/2006 | Ishihara |
| 7,218,380 B2 | 5/2007 | De Jager |
| 7,508,570 B1 | 3/2009 | Meisburger |
| 8,031,390 B2 | 10/2011 | Grasser et al. |
| 8,104,901 B2 | 1/2012 | Kwon |
| 8,199,178 B1 | 6/2012 | Payne |
| 8,282,221 B2 | 10/2012 | Arai et al. |
| 8,405,913 B2 | 3/2013 | Maeda |
| 8,472,104 B2 | 6/2013 | Stowe et al. |
| 8,520,045 B2 | 8/2013 | Maeda |
| 9,030,515 B2 * | 5/2015 | Stowe .................. B41J 2/465 347/239 |
| 2002/0044265 A1 | 4/2002 | Sumi |
| 2002/0140801 A1 | 10/2002 | Kubota |
| 2002/0171878 A1 | 11/2002 | Nakajima |
| 2004/0190573 A1 | 9/2004 | Kruschwitz et al. |
| 2006/0237404 A1 | 10/2006 | Ishikawa et al. |
| 2008/0055391 A1 | 3/2008 | Sakamoto et al. |
| 2008/0062390 A1 | 3/2008 | Zhang et al. |
| 2010/0165426 A1 | 7/2010 | Kihara et al. |
| 2010/0208329 A1 | 8/2010 | Sandstrom et al. |
| 2012/0281293 A1 | 11/2012 | Gronenborn |
| 2013/0016520 A1 | 1/2013 | Reimer et al. |
| 2013/0050669 A1 | 2/2013 | Maeda |
| 2014/0064305 A1 * | 3/2014 | Sipes, Jr. ............ G02B 19/0057 372/6 |

FOREIGN PATENT DOCUMENTS

| | | |
|---|---|---|
| EP | 1327527 A1 | 7/2003 |
| WO | 2006/083004 A2 | 8/2006 |

* cited by examiner

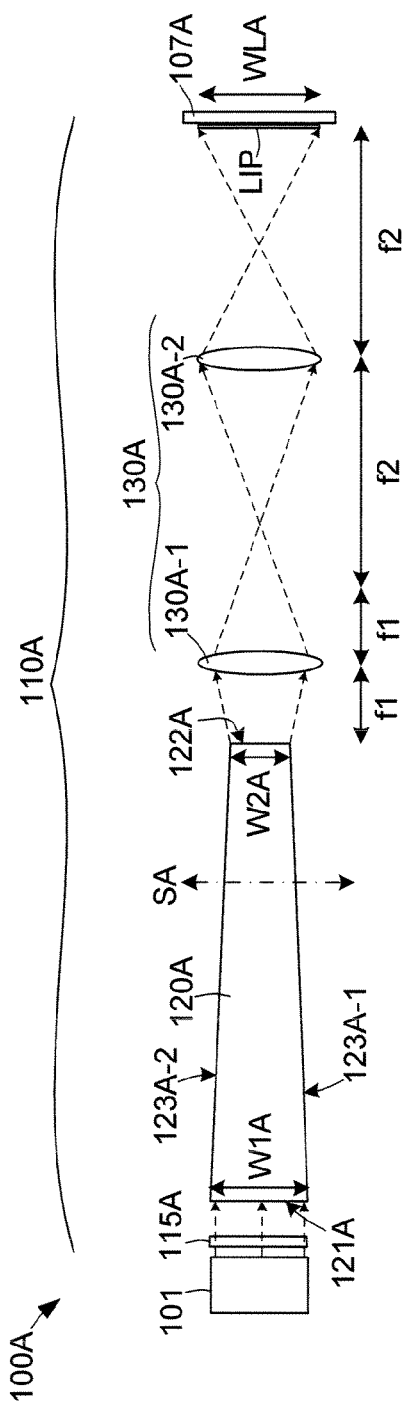
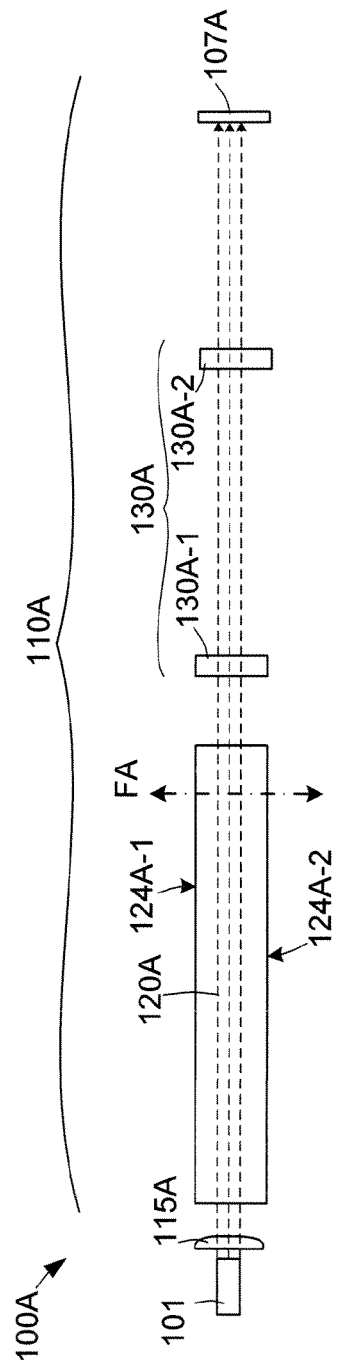
FIG. 2(A)
FIG. 2(B)

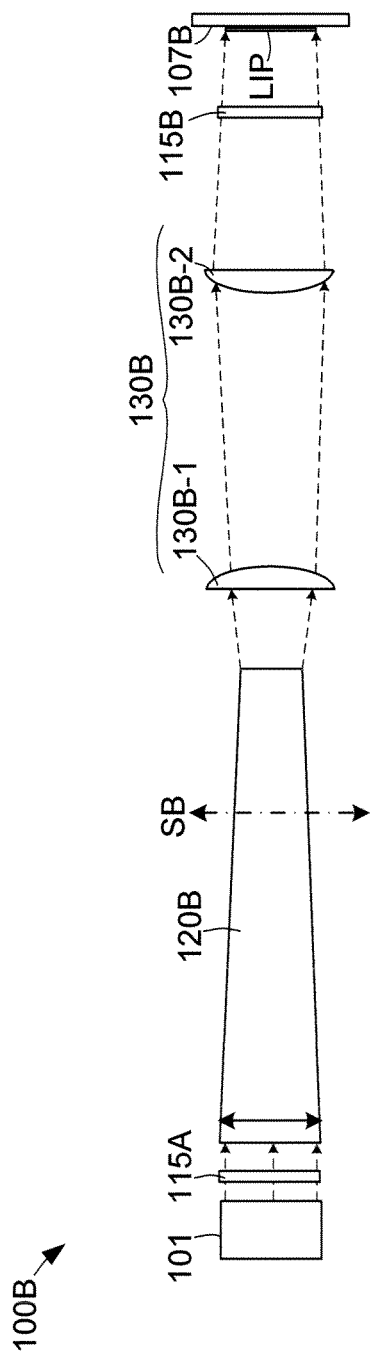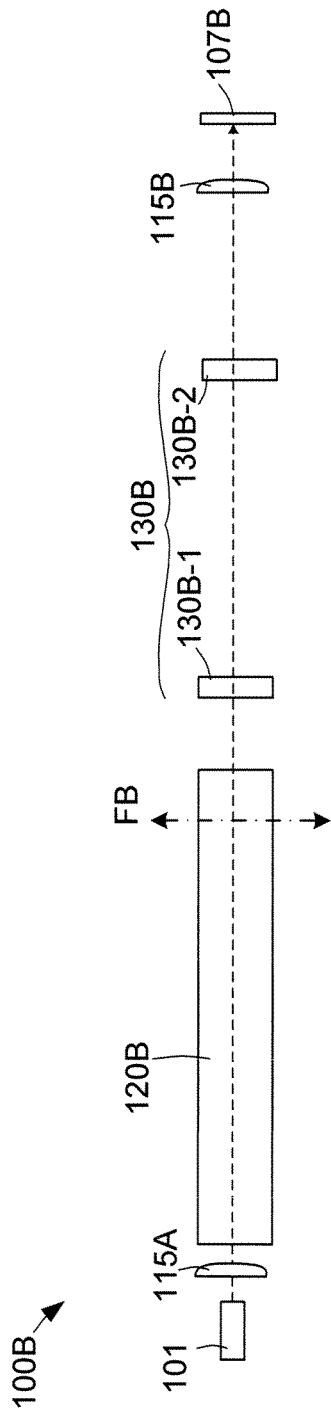
FIG. 6(A)
FIG. 6(B)

LIGHT GUIDE BASED OPTICAL SYSTEM FOR LASER LINE GENERATOR

FIELD OF THE INVENTION

This invention relates to imaging systems, and in particular to imaging systems that utilize high energy line illumination patterns for high speed image generation.

BACKGROUND OF THE INVENTION

A laser diode is an electrically pumped semiconductor laser in which the active medium is formed by a p-n junction of a semiconductor diode similar to that found in a light-emitting diode. A diode laser bar is a device including multiple laser diodes fabricated on a single substrate using semiconductor processing techniques, where the laser diodes are arranged in a straight line separated by small gaps, and light emitted from the laser diode "array" forms a series of linearly arranged parallel beams. Laser diode bars are used in high power laser applications that require more laser light than can be produced by a single laser diode. The most recent generation of high power laser diode bars (e.g., High Power Diode Laser Bar JDL-BAB-50-47-976-TE-120-2.0 produced by Jenoptik) include up to 47 laser diodes per laser diode bar with a 50% fill factor.

Many laser diode applications require the collection and homogenization of the coherent light generated by a laser diode bar. FIG. 10 is a simplified diagram depicting a conventional multiple aperture beam integration optical system 20 that utilizes two microlens arrays and a condenser lens to mix (convert) multiple coherent light beams CL in order to generate a homogenous light illumination pattern LIP on an imaging surface. Although conventional multiple aperture beam integration optical system 20 is suitable for use with laser diode bars having a relatively low number of laser diodes (e.g., 19 laser diodes) and 20% to 30% fill factors, it is difficult to utilize optical system 20 using more recent high power laser diodes (e.g., having 47 laser diodes and 50% fill factors). The microlens arrays of optical system 20 consist of multiple lenslets that are 0.2 mm to 0.5 mm in width and need to be precisely aligned. Higher laser diode bar fill factors (i.e., 40% to 50%) result in the emitter width taking up a larger fraction of the lenslet width, which could cause some of the light to fall on adjacent lenslets in the second microlens array and not be directed by the condenser lens to the proper position on the illumination area. To avoid this problem, additional lens arrays, such as slow-axis collimator telescope (SAC-TEL) microlens arrays, must be used. However, this arrangement requires a large number of individual elements that must be fabricated and precisely aligned, which leads to very high system manufacturing costs.

What is needed is a laser line generator system including an optical system that efficiently and cost-effectively collects and homogenizes coherent (laser) light generated, e.g., by laser diode bars such that the homogenous light forms a line illumination pattern on a target illumination plane. What is also needed is a single-pass imaging system and printing/scanning apparatus that utilize such a laser line generator system.

SUMMARY OF THE INVENTION

The present invention is directed to a laser line generator system including an optical system that utilizes a light guide to collect and homogenize coherent (laser) light generated by two or more diode lasers, and at least one slow-axis relay lens to project (focus) the homogenous light such that it forms an elongated homogenous line illumination pattern on a target illumination plane. The light guide is a solid integral optical element comprising a optically transparent dielectric material (e.g., glass or plastic) that is configured and positioned such that the coherent light undergoes total internal reflection whenever it impinges on the light guide walls as it propagates through the optical material, whereby the coherent light entering the light guide is mixed (converted) and exits the light guide as substantially homogenous light (i.e., light having an average intensity that varies by 10% or less over the entire area formed by the line illumination pattern. The slow-axis relay lens is positioned between the light guide and the illumination plane, and is configured to image the homogenous light exiting the light guide to form the desired elongated homogenous line illumination pattern on the target illumination plane (i.e., to magnify the line width to the desired size, adjust the beam divergence to the desired amount, and control the working distance from the condenser lens to the illumination plane such that the resulting elongated line illumination pattern is formed entirely by homogenous light and has the desired line width in the slow-axis direction). By utilizing a light guide to homogenize coherent laser light generated by multiple diode lasers, the present invention facilitates the generation of an elongated homogenous line illumination patterns using a reduced number of lenses and without the need for a fine pitched microlens array, thereby providing a laser line generator system that includes fewer optical elements, is more robust to fabrication errors, and is considerably easier to assemble and align. These factors reduce the overall manufacturing cost of the novel laser line generator system by an estimated factor of three to five times over conventional multiple aperture beam integration optical systems.

According to a practical embodiment of the invention, each of the diode lasers is configured to emit coherent light having a slow-axis direction and a fast-axis direction, and the laser diodes are aligned in the slow-axis direction such that the individual light portions generated by all of the diode lasers have the same orientation upon entering the light guide. Diode laser bars consist of edge-emitting laser arrays manufactured on wafers and diced into linear sections. The SA direction is parallel to the wafer plane and the FA direction is perpendicular to the wafer plane. This also results in a highly rectangular output aperture for each individual laser where the FA width of the laser output apertures are much smaller than the SA width. A larger aperture width produces a smaller output beam divergence angle and vice-versa. So the FA output beam divergence is larger than the SA output beam divergence by the inverse ratio of the aperture widths. According to a specific embodiment of the present invention, the laser diodes are integrally disposed on a high-power laser diode array/bar including a large number (e.g., twenty or more) of laser diode emitters aligned in the slow-axis direction and arranged in a high (i.e., greater than 40%) fill-factor configuration, and the tapered light guide includes a planar entrance face that is elongated in the slow-axis direction and positioned to receive the coherent light generated by all of the laser diodes. This arrangement facilitates the use of low-cost, high-power laser diode bars including up to forty-nine laser diodes that are disposed with a 50% fill factor. The light mixing provided by light guide, along with the increased number of diode lasers available on these laser diode bars helps to average out the light intensity non-uniformities from the interference effects associated with coherent light, thereby producing a relatively uniform (homogenous) line illumination pattern at the illumination plane.

According to another aspect of the invention, the tapered light guide is an integral solid structure including opposing planar side walls extending between the entrance face and a planar exit face, wherein a (first or entrance) width of the entrance face (i.e., measured in the slow-axis direction) is equal to or greater than a (second or exit) width of the exit face. In a specific embodiment, the light guide is tapered in the slow-axis direction such that a slow-axis entrance width of the entrance face is two- to three-times greater than a slow-axis exit width of the exit face. The generation of a high-intensity homogenous line illumination pattern using a high fill factor laser light array/bar (i.e., multiple laser diodes (coherent light sources) formed by semiconductor processing on a single substrate) in combination with a down-taper light guide is believed to be novel and non-obvious. That is, in conventional illumination systems, tapered and non-tapered light guides have been utilized solely in combination with incoherent, non-laser light sources to produce uniform light patterns—that is, light guides are not used with coherent laser light sources due to the presence of intensity non-uniformities caused by interference effects. In addition to collecting, mixing, and shaping the incoherent input light, tapered light guides are also used in conventional systems to reduce the divergence of the mixed light, so the light guide is configured such that the entrance face is smaller than the exit face (i.e., the tapered light guide is conventionally used in an "up-taper" configuration). The present inventors have determined through experimentation that, by using a 2× or 3× down-taper in combination with a high fill factor (i.e., 40% to 50%) laser diode bar having a large number of laser diodes (e.g., twenty or more), light exiting the waveguide is substantially homogenized. Moreover, by providing the wave guide with sufficient length, the present inventors have found that light guides having parallel side walls (i.e., in the slow-axis direction) or parallel wave guide in combination with a high fill factor (i.e., 40% to 50%) laser diode bar having a large number of laser diodes (e.g., twenty or more), light exiting the waveguide is substantially homogenized.

According to a presently preferred embodiment, the slow-axis relay lens function is implemented using a Keplerian telescope including two slow-axis lenses that are configured and arranged to cooperatively image the homogenized light exiting the light guide onto the illumination plane. Specifically, the Keplerian telescope is configured such that the homogenized light is magnified by the slow-axis lenses in the slow-axis (width) direction to a desired line width value (i.e., such that the homogenized light beam divergence is adjusted to a desired divergence level), and arranged such that a working distance from second slow-axis lens to the illumination plane is equal to the focal length of the second slow-axis lens, thereby forming the line illumination pattern with a uniform intensity profile and sharp edges. In a specific embodiment, each of the slow-axis lenses is a cylinder lens having at least one acylindrical surface, which produces superior laser line performance in terms of edge sharpness and intensity profile across the line width in the slow-axis direction. In alternative embodiments, the acylindrical surface of each cylinder lens has one of a conic shape or a polynomial shape. In an exemplary practical embodiment, the light guide is produced with an exit face aligned in the slow-axis direction, and the Keplerian telescope comprises cylindrical lenses positioned and arranged such that the line illumination pattern has a line width equal to the exit (second) width of the light guide multiplied by a first focal length of the first slow-axis lens and divided by a second focal length of the second slow-axis lens. Using this arrangement in conjunction with a 3-to-1 down-tapered light guide (e.g., having a 12 mm entrance width and a 4 mm exit width), a Keplerian telescope first/second focal length ratio of 2.76, and using a laser diode bar generating coherent light having a wavelength in the range of 976 and 1020 nm, the inventors generated a superior line illumination pattern having a line width of approximately 11 mm. In an alternative embodiment, a Keplerian telescope is utilized in which each of the slow-axis lenses is an acylindrical lens.

According to another embodiment, one or more fast-axis (FA) lenses are disposed in the optical path between the laser diode bar and the illumination plane to collimate the laser light in the fast-axis direction. As understood in the art, the coherent line is generated by a laser diode bar such that, in the fast-axis direction, the diode laser beams are Gaussian and are focused according to the laws of Gaussian beam propagation. In one specific embodiment, a (first) FA lens is disposed between the laser diode bar and the light guide, where the FA lens is configured to collimate the coherent light exiting the laser diode bar before entering the light guide in order to homogenize the line illumination pattern LIP in the fast-axis direction. An optional second FA lens is disposed between the Keplerian telescope and the illumination plane to assist in focusing the homogenous light at the illumination plane.

The present invention is also directed to a single-pass imaging system that utilizes the light line generator system described above, a spatial light modulator disposed to receive the line illumination pattern and controlled to modulate the homogenous light according to predetermined scan line image data, and an anamorphic optical system that focuses the modulated homogenous light to a form a narrow scan line image. According to a preferred embodiment of the present invention, the spatial light modulator comprises a DLP™ chip from Texas Instruments, referred to as a Digital Light Processor in the packaged form.

According to another practical embodiment of the present invention, a scanning/printing apparatus includes the single-pass imaging system described above, and a scan structure (e.g., an imaging drum cylinder) that is disposed to receive the concentrated modulated light from the anamorphic optical system. According to a specific embodiment, the imaging surface may be one that holds a damping (fountain) solution such as is used for variable data lithographic printing.

BRIEF DESCRIPTION OF THE DRAWINGS

These and other features, aspects and advantages of the present invention will become better understood with regard to the following description, appended claims, and accompanying drawings, where:

FIGS. 2(A) and 2(B) are simplified top and side views showing laser line generator system according to an embodiment of the present invention during operation;

FIGS. 6(A) and 6(B) are simplified top and side views showing laser line generator system according to another embodiment of the present invention during operation;

DETAILED DESCRIPTION OF THE DRAWINGS

The present invention relates to improvements in imaging systems and related apparatus (e.g., scanners and printers). The following description is presented to enable one of ordinary skill in the art to make and use the invention as provided in the context of a particular application and its requirements. As used herein, directional terms such as "vertical", "horizontal", "top", "side", "lower", and "front", are intended to provide relative positions for purposes of description, and are not intended to designate an absolute frame of reference. In addition, the phrase "integrally formed" is used herein to describe the connective relationship of a single molded or machined structure. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
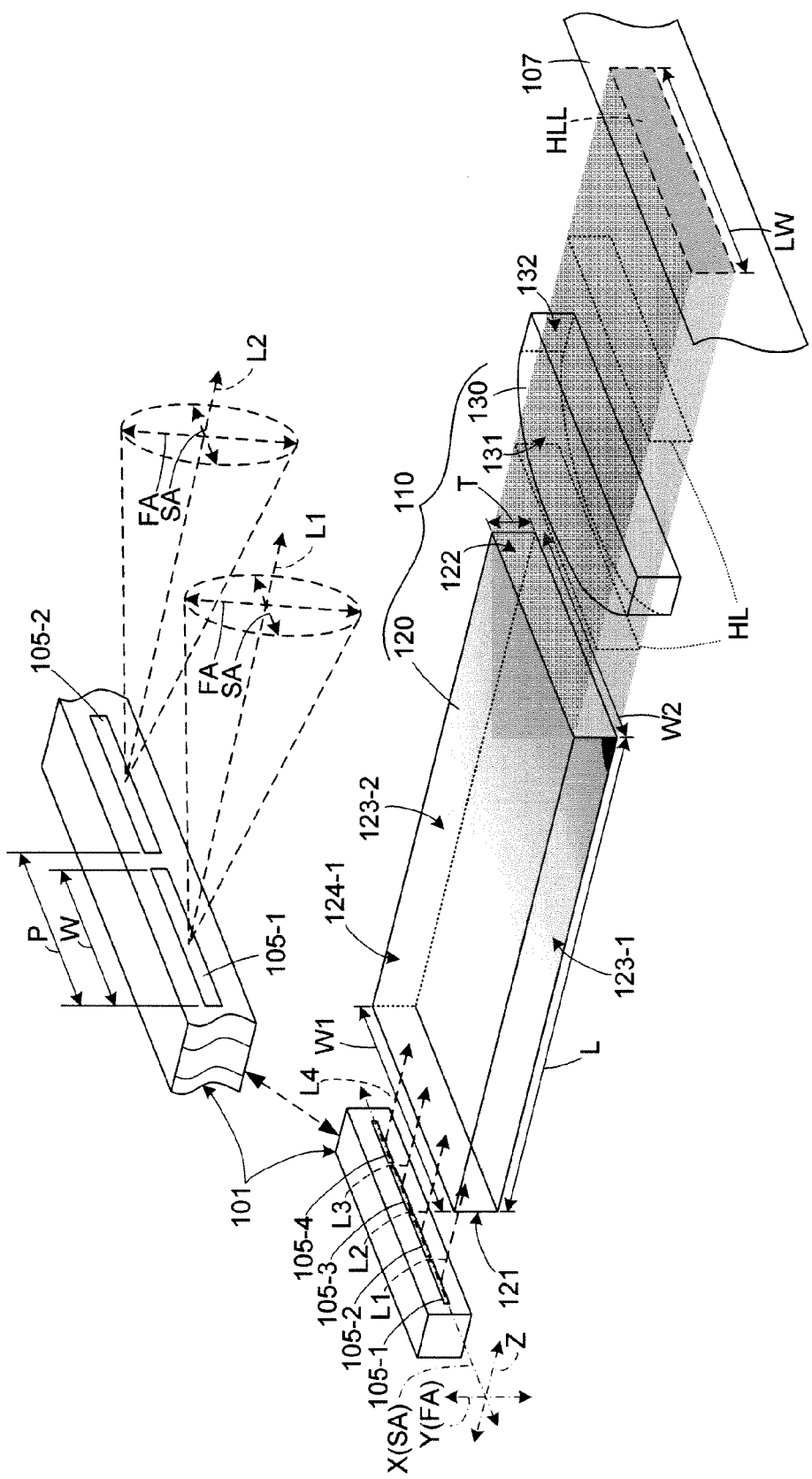
FIG. 1 is a top side perspective view showing a generalized laser line generator system according to an exemplary embodiment of the present invention.

FIG. 1 is a top side perspective view showing a generalized laser line generator system 100 including an optical system 110 that utilizes a light guide (optical element) 120 to collect and homogenize coherent (laser) light beams L1 to L4 generated by associated diode lasers 105-1 to 105-4, and at least one slow-axis relay lens 130 to project (focus) substantially homogenous light HL exiting light guide 120 such that it forms an elongated homogenous line illumination pattern LIP on a target illumination plane 107.

In accordance with a preferred embodiment, system 100 includes a laser diode bar 101 including diode lasers 105-1 to 105-4 integrally formed on a semiconductor substrate according to known fabrication techniques. As indicated by diode laser 105-1 in the enlarged section shown at the top of FIG. 1, each diode laser 105-1 to 105-4 has a width W extending and diode lasers 105-1 to 105-4 are spaced at a pitch P in a horizontal (orthogonal X-axis) direction on a face of laser diode bar 101. Diode lasers 105-1 to 105-4 emit associated coherent light beams L1 to L4 in parallel Z-axis directions such that, as illustrated in the enlarged section, each light beam L1 to L4 has a slow-axis direction SA aligned in the horizontal (X-axis) direction and a fast-axis direction FA aligned in the vertical (Y-axis) direction.

Diode lasers 105-1 to 105-4 are arranged aligned in the horizontal direction on laser diode bar 101 such that the individual light portions L1 to L4 generated by all of the diode lasers 105-1 to 105-4 have the same orientation upon entering light guide 120 (i.e., as indicated at the top of FIG. 1, such that the slow-axis directions of light beams L1 and L2 are "horizontal", and the fast-axis direction of light beams L1 and L2 are "vertical" when they enter the light guide element). Although diode laser bar 101 is shown with four laser diodes 105-1 to 105-4 to simplify the description, it is understood that laser diode bar 101 includes a large number (e.g., twenty or more) laser diodes (emitters) disposed at a fill-factor (i.e., laser diode width W divided by pitch P) that is greater than 40%. In a according to a preferred embodiment, laser diode bar 101 comprises a recent generation high power laser diode bar including up to forty-nine laser diodes disposed at a fill factor of 50% or greater.

Light guide 120 is a solid optical element that is positioned in the Z-axis direction relative to laser diode bar 101 such that it receives (collects) coherent light beams L1 to L4, and configured to mix (homogenize) the coherent light such that substantially homogenous light HL (i.e., non-coherent light having intensity variations of less than 2%) exits light guide 120 that is directed in the Z-axis direction. Light guide 120 comprises optically transparent dielectric material (e.g., transparent/clear glass or plastic) that is integrally formed using known techniques, and includes a planar entrance face 121, a planar exit face 122, opposing planar side walls 123-1 and 123-2 and opposing upper and lower walls 124-1 and 124-2 extending between entrance face 121 and exit face 122. Light guide 120 is positioned relative to laser diode bar 101 such that planar entrance face 121 is disposed in the XY-plane and is perpendicular to the emission (Z-axis) direction of light beams L1 to L4. Planar exit face 122 is parallel to entrance face 121. Side walls 123-1 and 123-2 are configured (e.g., parallel or down-tapered as described below) to generate total internal reflection of the coherent laser light as light beams L1 to L4 propagate through said light guide 120. Specifically, in the SA direction, the light undergoes total internal reflection whenever it impinges on the side walls as it propagates through light guide structure 120, whereby the additional light mixing generated by the large number of diode lasers/light beams serves to average out the light intensity non-uniformities from the interference effects associated with coherent light to produce substantially homogenous light at exit face 122. In the FA direction, the light is shaped by the FA collimator lens to be smaller than the light guide as it propagates through the entire length of the light guide and therefore does not impinge upon the upper and lower walls. The homogenization (mixing) of coherent light is depicted in FIG. 1 by way of gradual shading between entrance face 121 and exit face 122 (i.e., with relatively coherent light indicated by light or no shading, and substantially homogenous light indicated by darker shading).

According to an aspect of the present invention, side walls 123-1 to 123-2 of light guide 120 are either parallel or down-tapered. That is, referring to FIG. 1, a (first) width W1 of entrance face 121 (i.e., measured in the X-axis direction) is shown as equal to a second width W2 of exit face 122, whereby side walls 123-1 and 123-2 are non-tapered (i.e., parallel). Alternatively, FIG. 2 shows a system 100A including a light guide 120A in which width W1A of entrance face 121A is greater than a second width W2A of exit face 122A (i.e., side walls 123A-1 and 123A-2 are down-tapered). The use of either non-tapered light guide 120 or down-tapered light guide 120A in conjunction with a coherent (i.e., laser) light source (e.g., a laser light bar) distinguishes laser line generator systems of the present invention over conventional arrangements. That is, tapered and non-tapered light guides have been utilized in conventional illumination systems solely in combination with incoherent, non-laser light sources but prior to the present invention, light guides were not used in combination with coherent, laser light sources due to the presence of intensity non-uniformities caused by interference effects. In addition, in applications where light guides were used to collect, mix, and shape light to produce a light pattern of near uniform intensity, tapered light guides were typically used in an "up-taper" configuration (i.e., where the smaller end face is the entrance face and the larger end face is the exit face) to reduce the divergence of the incoherent light. Although the use of a light guide increases the optical length of system 100 over conventional multiple-lens approaches, the combination of high density coherent light sources (e.g., such as those found on recent generation high power laser diode bars) with non-tapered or down tapered light guides generates superior homogenous light while minimizing manufacturing cost and complexity.

Referring again to FIG. 1, slow-axis relay lens 130 is positioned between light guide 120 and illumination plane 107, and is configured to image homogenous light HL exiting light guide 120 such that the image homogenous light HL forms line illumination pattern LIP on illumination plane 107 with a predetermined elongated line width WL that extends in the X-axis direction. That is, the purpose of slow-axis relay lens 130 is to magnify homogenous light HL such that line width WL has the desired size at illumination plane 107, to adjust the beam divergence to the desired amount, and to control the working distance to illumination plane 107 such that line illumination pattern LIP is formed entirely by homogenous light and has the desired line width LW in the X-axis (i.e., slow-axis) direction. By utilizing light guide 120 to homogenize coherent laser light generated by diode lasers 105-1 to 105-4 and slow-axis relay lens 130 to image homogenized light on illumination plane 107, the present invention facilitates the generation of elongated homogenous line illumination patterns LIP using a reduced number of lenses and without the need for a fine pitched microlens array, whereby laser line generator system 100 includes fewer optical elements, is more robust to fabrication errors, and is considerably easier to assemble and align. These factors reduce the overall manufacturing cost of laser line generator system 100 by an estimated factor of three to five times over conventional multiple aperture beam integration optical systems.

FIGS. 2(A) and 2(B) shows a laser line generator system 100A according to a specific embodiment of the present invention including laser diode bar 101 (described above), tapered light guide 120A (mentioned above), a Keplerian telescope 130A, and an optional fast-axis (FA) lens 115A.

Figure 3:
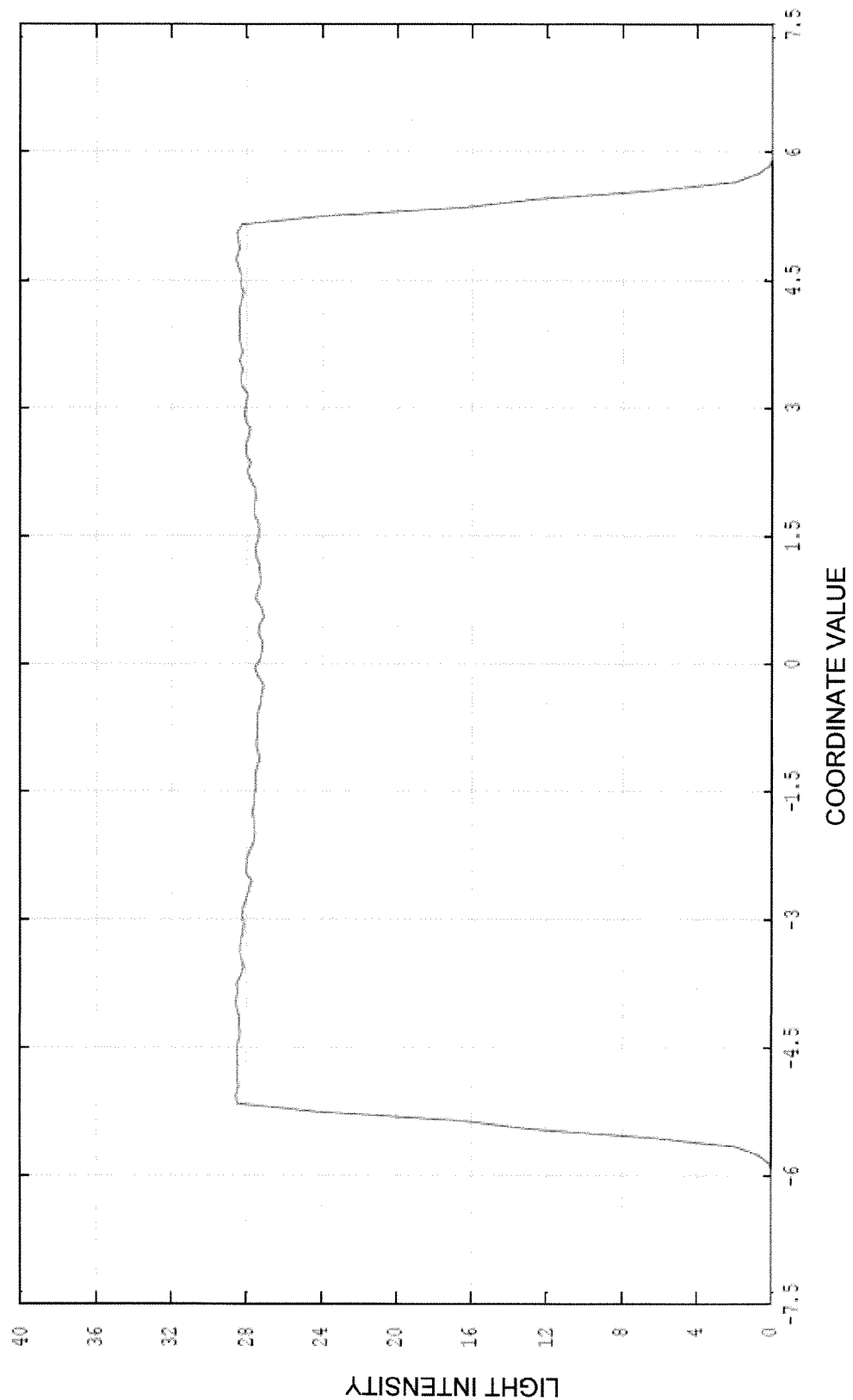
FIG. 3 is a diagram showing an exemplary line intensity profile for a laser line illumination pattern generated by the system of FIGS. 2(A) and 2(B)
Figure 4:
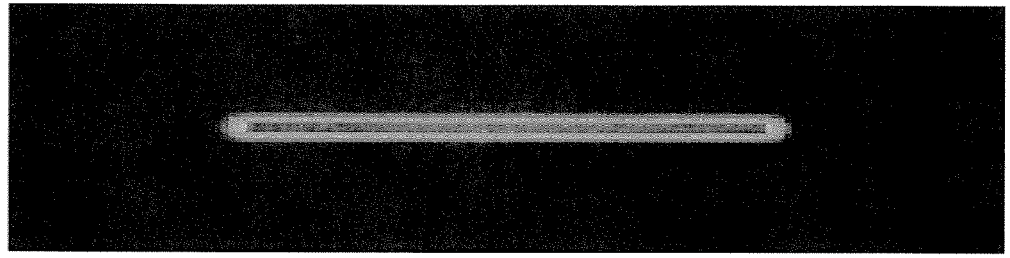
FIG. 4 is diagram showing irradiance of the laser line illumination pattern generated by the system of FIGS. 2(A) and 2(B)
Figure 5:
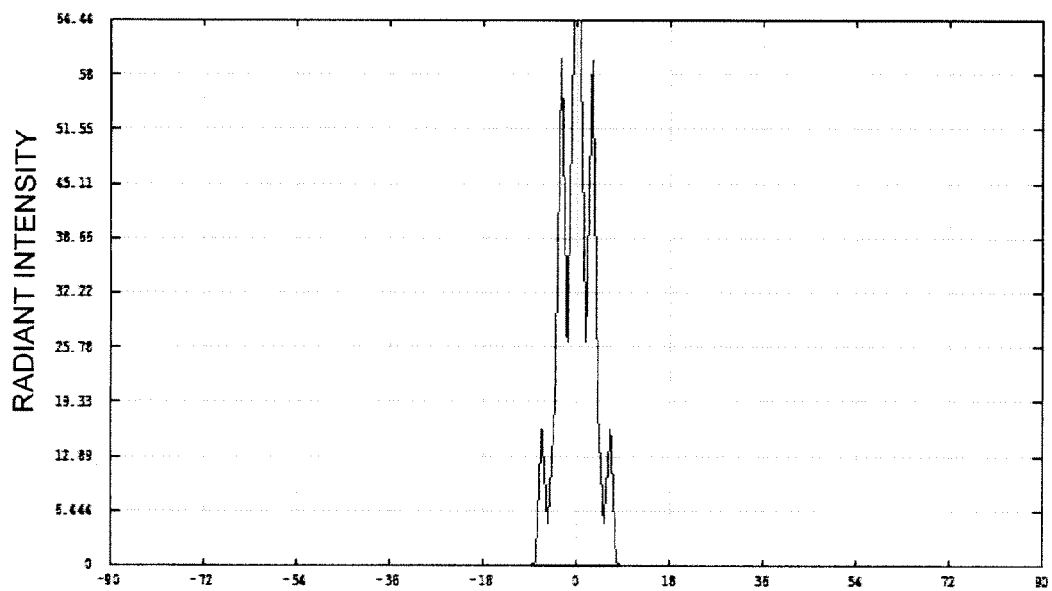
FIG. 5 is diagram showing slow-axis beam divergence of the laser line illumination pattern generated by the system of FIGS. 2(A) and 2(B)

Tapered light guide 120A is an optical element formed in a manner similar to that described above including a planar entrance face 121A, a planar exit face 122A, planar side walls 123A-1 and 123A-2, and planar upper/lower walls 124A-1 and 124A-2. According to the present embodiment, tapered light guide 120A has a down-taper of 2-to-1 or greater in the slow-axis direction SA (i.e., wherein width W1A of entrance face 121A is at least two times width W2A of exit face 122A, as indicated in FIG. 2(A)), and includes zero taper in the fast-axis direction FA (i.e., upper surface 124A-1 and lower surface 124A-2 are parallel, as indicated in FIG. 2(B)). With this arrangement, light from diode bar 101A reflects off of the light guide walls in the slow-axis (SA) direction only, and produces a light intensity profile at the illumination plane similar to that depicted in FIG. 3, and produces a line illumination pattern at the illumination plane similar to that shown in FIG. 4. In the fast-axis (FA) direction, the non-tapered arrangement is designed so that the light travels through the light guide without reflecting off of the light guide side walls. The light intensity profile in the FA direction is Gaussian and the narrow width of the Gaussian profile is determined by the properties of the FA beam divergence of the laser diodes and the FA collimator lens. With this arrangement, light from diode bar 101A passes directly through the light guide, and produces substantially homogenous light with an irradiance distribution at the illumination plane similar to that shown in FIG. 4, with an angular distribution at the illumination plane similar to that depicted in FIG. 5.

According to an aspect of the embodiment shown in FIGS. 2(A) and 2(B), the slow-axis relay lens function performed by lens 130 in FIG. 1 is implemented using Keplerian telescope 130A, which includes slow-axis cylinder lenses 130A-1 and 130A-2 that are configured to have focal lengths f1 and F2, respectively, and are arranged as shown in FIG. 2(A) to cooperatively image homogenized light exiting light guide 110A onto illumination plane 107A. Specifically, Keplerian telescope 130A is configured such that homogenized light is magnified by the slow-axis lenses 130A-1 and 130A-2 in the slow-axis (width) direction to a desired line width value WLA (i.e., such that the homogenized light beam divergence is adjusted to a desired divergence level), and arranged such that a working distance from second slow-axis lens 130A-2 to the illumination plane 107A is equal to focal length f2 of second slow-axis lens 130A-2, thereby forming line illumination pattern LIP with a uniform intensity profile and sharp edges. In a specific embodiment, each of the slow-axis cylinder lenses 130A-1 and 130A-2 is has at least one acylindrical surface, which produces superior laser line performance in terms of edge sharpness and intensity profile across the line width in the slow-axis direction. In alternative embodiments, the acylindrical surface of each cylinder lens has one of a conic shape or a polynomial shape.

Referring again to FIGS. 2(A) and 2(B), laser line generator system 100A also includes a fast-axis (FA) lens 115A disposed in the optical path between laser diode bar 101 and light guide 120, and serves to collimate the coherent laser light in the fast-axis direction before entering light guide 120A. As understood in the art, the coherent line is generated by a laser diode bar such that, in the fast-axis direction, the diode laser beams are Gaussian and are focused according to the laws of Gaussian beam propagation. FA lens 115A is disposed and configured to collimate the coherent light exiting the laser diode bar 101A before entering the light guide 120A in order to homogenize line illumination pattern LIP in the fast-axis (FA) direction.

Table 1 (below) includes an optical design prescription providing additional details regarding system 100A according to the illustrated practical embodiment. By arranging Keplerian telescope 130A in the manner illustrated in FIGS. 2(A) and 2(B), line illumination pattern LIP is generated at illumination plane 107A having a line width WLA that is equal to the exit (second) width W2A of exit face 122A multiplied by focal length $f_1$ of slow-axis lens 130A-1 and divided by focal length f2 of slow-axis lens 130A-2 (i.e., WLA=W2A×(f1/f2). Using the specifications of Table 1, e.g., such that light guide 120A has a 3-to-1 down-tapered light guide (e.g., having a 12 mm entrance width W1A and a 4 mm exit width W2A), and forming Keplerian telescope 130A with a first/second focal length ratio f2/f1 of 2.76, and using a laser diode bar of a type (e.g., Aluminum Indium Gallium Arsenide Phosphide (Al—In—Ga—As—P)) that generates coherent light having a wavelength λ in the range of 976 and 1020 nm, the inventors generated a superior line illumination pattern having a line width WLA of approximately 11 mm.

TABLE 1

| Object | Surface | Surface Shape | Radius of Curvature (mm) | Conic Constant | Even Asphere Polynomial Coefficients | Position (mm) | Thickness (mm) | Material |
|---|---|---|---|---|---|---|---|---|
| Diode Bar 101 | Exit face | | | | | 0.000 | | |
| FAC Lens 115A | Front face | Plano | | | | 0.090 | 1.970 | TIH53 |
| | Rear face | Acylindrical Convex | −0.977143 | −3.43646 | $\alpha_4 = -0.395787$ $\alpha_5 = 0.272625$ $\alpha_8 = -0.233477$ $\alpha_{10} = 0.079769$ | 2.060 | | |
| Tapered Waveguide 120A | Front face | Plano, $W_1 = 12$ mm | | | | 2.500 | 100.000 | N-BK7 |
| | Rear face | Plano, $W_2 = 4$ mm | | | | 102.500 | | |
| SA Acylinder Lens 1 130A-1 | Front face | Plano | | | | 124.300 | 6.800 | N-BK7 |
| | Rear face | Acylindrical Convex | −13.6 | −1 | | 131.100 | | |
| SA Acylinder Lens 2 130A-2 | Front face | Acylindrical Convex | 37.5 | −1 | | 229.300 | 6.800 | N-BK7 |
| | Rear face | Plano | | | | 236.100 | | |
| 107A Illumination Plane | | | | | | 308.000 | 50.000 | |

The acylindrical surface equation (EQ. 1, copied below) describes the acylindrical surface shape of FA lens 115A according to the exemplary embodiment:

$$z = \frac{Cr^2}{1 + \sqrt{1 - (1+k)C^2 r^2}} + \alpha_1 r^2 + \alpha_2 r^4 + \alpha_3 r^6 + \alpha_4 r^8 + \alpha_5 r^{10} + \alpha_6 r^{12} + \alpha_7 r^{14} + \alpha_8 r^{16} \quad \text{EQ. 1}$$

where z is surface sag, C is surface curvature (1/R), R is surface radius of curvature (1/C), r is radial coordinate, k is conic constant of surface, where k>0 describes oblate spheroid, k=0 describes a sphere, −1<k<0 describes an oblate spheroid, k=−1 describes a parabola, and k<−1 describes a hyperbola.

The specific embodiment described above with reference to FIGS. 2(A) and 2(B) is intended to be exemplary, and other optional features (e.g., those described below) may be implemented while remaining within the spirit and scope of the claimed invention.

FIGS. 6(A) and 6(B) shows a laser line generator system 100B according to another specific embodiment that utilizes laser diode bar 101 and a down-tapered light guide 130B in the manner similar to that described above, but differs in a few respects that are set forth below.

First, laser line generator system 100B differs from the earlier embodiment in that Keplerian telescope 130B formed by two acylindrical lenses 130B-1 and 130B-2 (i.e., instead of cylindrical lenses) having conic surfaces. The acylindrical lenses provide the needed magnification and imaging without introducing a large amount of optical aberrations. This results in a more uniform irradiance distribution with sharper edges at the illumination plane.

Second, laser line generator system 100B includes both first fast-axis (FA) lens 115A disposed in the optical path between laser diode bar 101 and light guide 120B, and an optional second FA lens 115B disposed between Keplerian telescope 130B and illumination plane 107B. As in the embodiment shown and described with reference to FIGS. 2(A) and 2(B), first FA lens 115A serves to collimate the coherent laser light in the fast-axis direction before entering light guide 120B. When present, optional second FA lens 115B serves to assist in focusing the homogenous light at illumination plane 107B. In the FA direction the light does not impinge on the upper and lower surfaces of the light guide since the beam width is always much smaller than the width of the light guide in the FA direction. Therefore the light guide does not have to be tapered in the FA direction and the upper and lower surfaces do not have to be polished optical surfaces.

Any of the laser line generator optical systems described above may be utilized in more complex systems and apparatus, such as those described below with reference to FIGS. 7 to 9.

Figure 7:
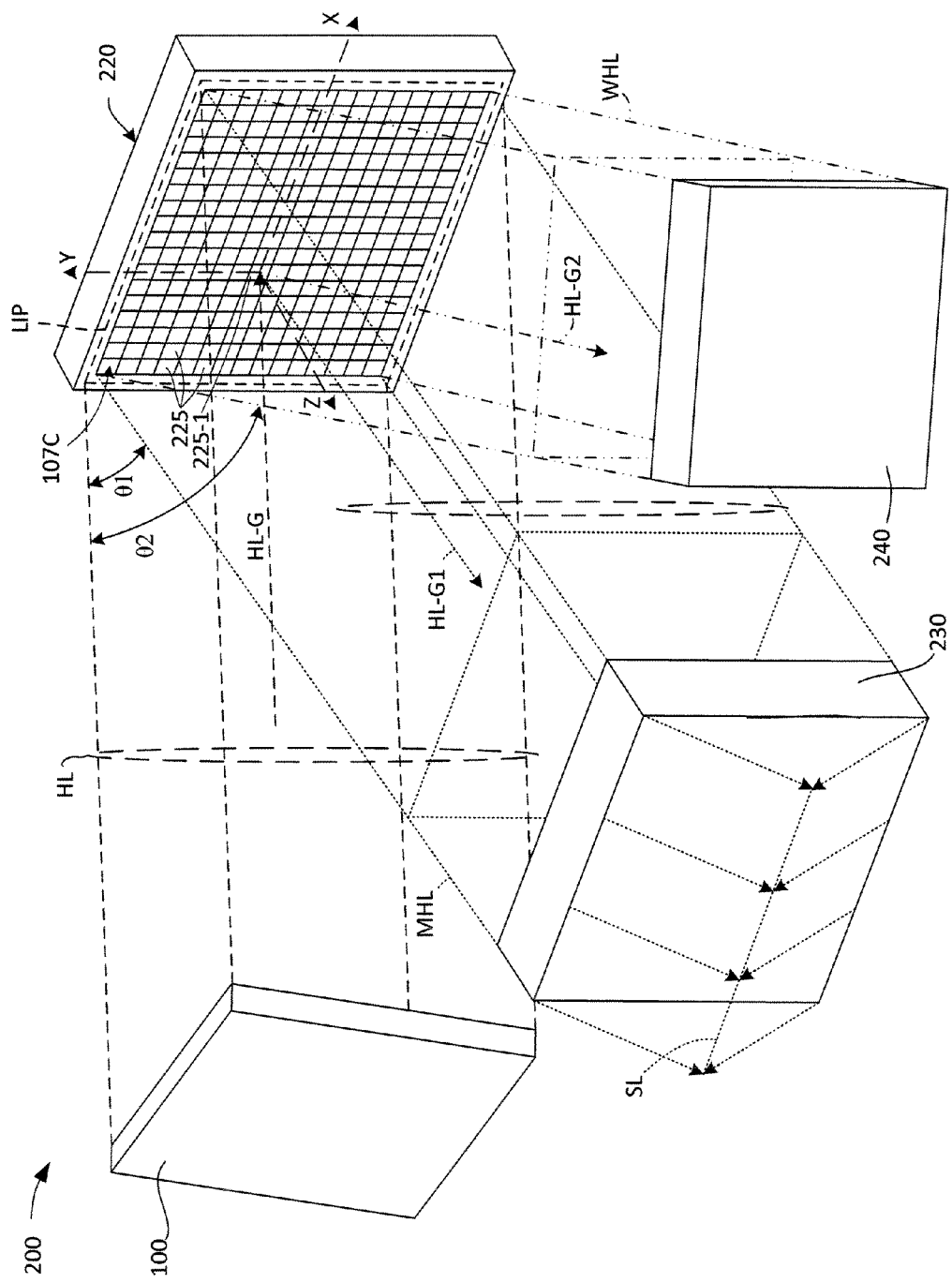
FIG. 7 is a perspective top front view showing a single-pass imaging system utilizing the laser line generator system according to another embodiment of the present invention.

FIG. 7 is a perspective view showing a single-pass imaging system 200 according to a practical exemplary embodiment of the present invention. Imaging system 200 utilizes line generator optical system 100, which is indicated by a dashed-line box for brevity and includes any of the details described above, to generate homogenous light generator HL that forms line illumination pattern LIP on a spatial light modulator 220, whose surface forms an illumination plane 107C in a manner consistent with the description above. Imaging system 200 also includes an anamorphic (second) optical system 230 represented for the purposes of simplification in FIG. 1 by a block-type structure, where optical system 230 is positioned to receive modulated light reflected from spatial light modulator in the manner described below, and arranged to concentrate the modulated light to produce an elongated scan line image SL. In practice anamorphic system 230 is typically composed of multiple separate cylindrical or acylindrical lenses, such as described in co-owned U.S. Pat. No. 8,472,104 entitled SINGLE-PASS IMAGING SYSTEM USING SPATIAL LIGHT MODULATOR AND ANAMORPHIC PROJECTION OPTICS, which is incorporated herein by reference in its entirety.

Spatial light modulator 220 serves the purpose of reflecting (modulating) portions of homogenous light HL in accordance with predetermined scan line image data, whereby spatial light modulator 220 generates a modulated light field MHL that is projected onto anamorphic optical system 230. Spatial light modulator 220 includes mirrors (modulating elements) 225 disposed in a two dimensional array on a support structure, and a control circuit configured to transmitting control signals to modulating elements 225 in response to the scan line image data, whereby each modulating element 225 is individually controlled between "on" and "off" states. Modulating elements 225 are disposed such that a mirror (or other light modulating structure such as a diffractive element or a thermo-optic absorber element) of each modulating element 225 receives a corresponding portion of homogenous light HL (e.g., modulating element 125-1 receives homogenous light portion HL-G), and is positioned to selectively pass or redirect the received corresponding modulated light portion along a predetermined direction toward anamorphic optical system 230 in accordance with its current "on" or "off" state.

In particular, each light modulating element 225 is individually controllable to switch between an "on" (first) modulated state and an "off" (second) modulated state in response to associated portions of scan line image data ID. When a given modulating element (e.g., modulating element 225-1) is in the "on" modulated state, the modulating element is actuated to direct the given modulating element's associated received light portion (e.g., light portion HL-G) toward anamorphic optic 230 (i.e., as indicated by reflected light portion HL-G1). Conversely, when modulating element 225-1 is in the "off" modulated state, the modulating element is actuated to prevent (e.g., block or redirect) the given modulating element's associated received light portion (e.g., light portion HL-G) from reaching anamorphic optical system 230 (i.e., as indicated by reflected light portion HL-G2). In the illustrated example, reflected light portion HL-G2, along with all other "waste" light WL reflected from "off" modulating elements, is directed onto a heat sink 240. By selectively turning "on" or "off" modulating elements 225 in accordance with image data supplied to the device controller from an external source (not shown), spatial light modulator 220 serves to modulate (i.e., pass or not pass) portions of continuous homogenous light HL such that a two-dimensional modulated light field MHL is generated that is passed to anamorphic optical system 230.

According to an aspect of the present invention, light modulating elements 225 of spatial light modulator 220 are disposed in a two-dimensional array of rows and columns, and anamorphic optical system 230 is arranged to concentrate light portions passed through each column of modulating elements on to corresponding horizontally spaced imaging regions of scan line image SL. As used herein, each "column" includes light modulating elements arranged in a direction that is substantially perpendicular to scan line image SL, and each "row" includes light modulating elements arranged in a direction substantially parallel to scan line image SL.

Figure 8A:
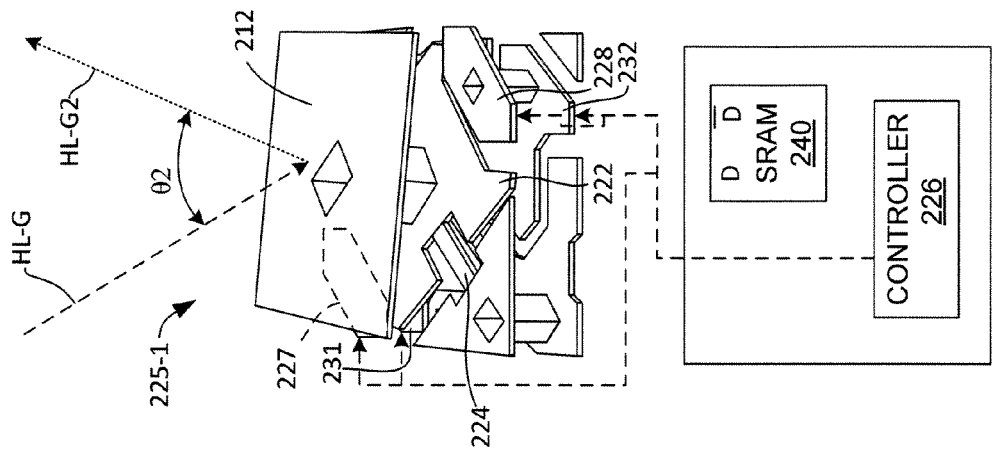
FIGS. 8(A), 8(B) and 8(C) are perspective views showing a single light modulating element of the spatial light modulator shown in FIG. 7 during operation.
Figure 8B:
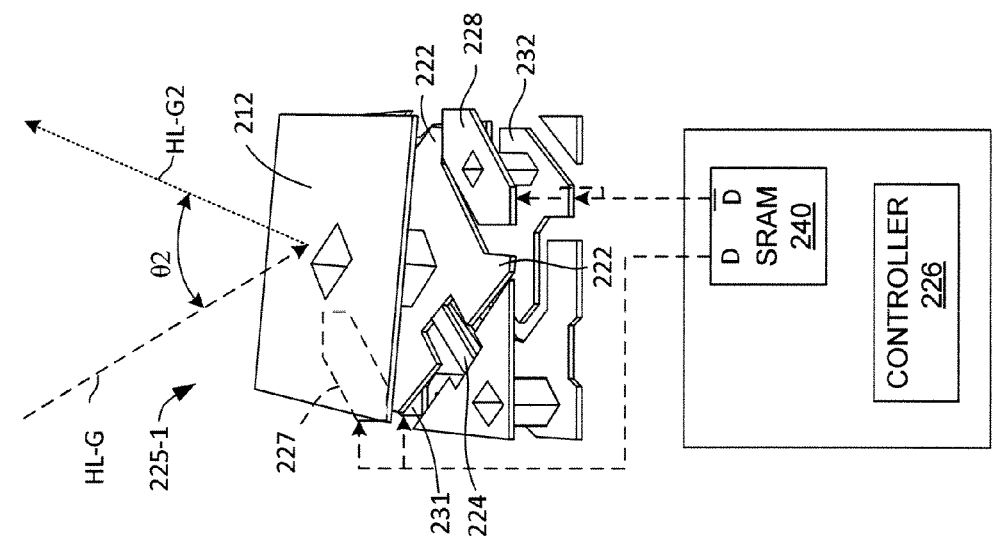
Figure 8C:
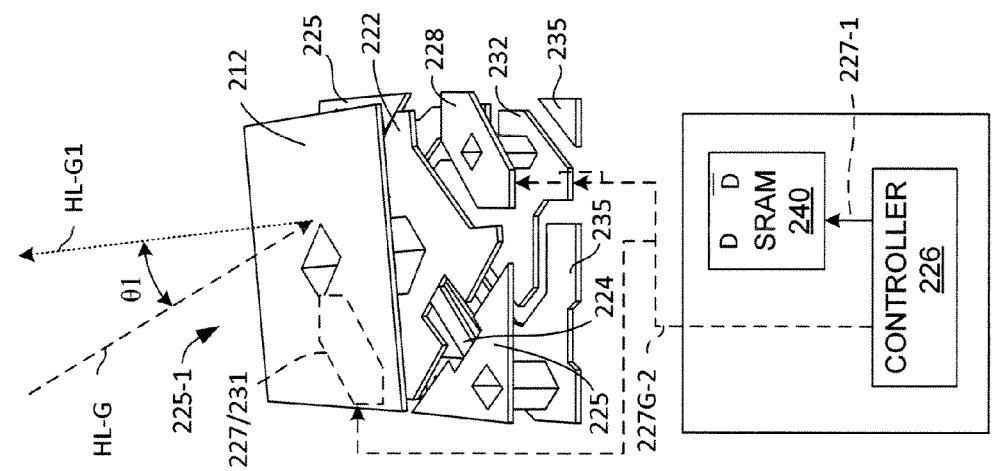

FIGS. 8(A) to 8(C) are perspective/block views showing mirror mechanism 225-1 of FIG. 7 in additional detail. FIG. 8(A) shows mirror mechanism 225-1 in a first (e.g., "on") modulating state in which received light portion HL-G becomes reflected (modulated) light portion HL-G1 that leaves mirror 212 at a first angle θ1. To set the "on" modulating state, SRAM memory cell 241 stores a previously written data value such that output signal D includes a high voltage (VDD) that is transmitted to electrode plate 231 and raised electrode 227, and output signal D-bar includes a low voltage (ground) that is transmitted to electrode plate 232 and raised electrode 228. These electrodes control the position of the mirror by electrostatic attraction. The electrode pair formed by electrode plates 231 and 232 is positioned to act on yoke 222, and the electrode pair formed by raised electrodes 227 and 228 is positioned to act on mirror 212. The majority of the time, equal bias charges are applied to both sides of yoke 222 simultaneously (e.g., as indicated in FIG. 8(A), bias control signal 227G-2 is applied to both electrode plates 227 and 228 and raised electrodes 231 and 232). Instead of flipping to a central position, as one might expect, this equal bias actually holds mirror 212 in its current "on" position because the attraction force between mirror 212 and raised electrode 231/electrode plate 227 is greater (i.e., because that side is closer to the electrodes) than the attraction force between mirror 212 and raised electrode 232/electrode plate 228.

To move mirror 212 from the "on" position to the "off" position, the required image data bit is loaded into SRAM memory cell 241 by way of control signal 227G-1 (see the lower portion of FIG. 8(A). As indicated in FIG. 8(A), once all the SRAM cells have been loaded with image data, the bias control signal is de-asserted, thereby transmitting the D signal from SRAM cell 241 to electrode plate 231 and raised electrode 227, and the D-bar from SRAM cell 241 to electrode plate 232 and raised electrode 228, thereby causing mirror 212 to move into the "off" position shown in FIG. 8(B), whereby received light portion HL-G becomes reflected light portion HL-G2 that leaves mirror 212 at a second angle θ2. In one embodiment, the flat upper surface of mirror 212 tilts (angularly moves) in the range of approximately 10 to 12° between the "on" state illustrated in FIG. 8(A) and the "off" state illustrated in FIG. 8(B). When bias control signal 227G-2 is subsequently restored, as indicated in FIG. 8(C), mirror 212 is maintained in the "off" position, and the next required movement can be loaded into memory cell 241. This bias system is used because it reduces the voltage levels required to address the mirrors such that they can be driven directly from the SRAM cells, and also because the bias voltage can be removed at the same time for the whole chip, so every mirror moves at the same instant.

As indicated in FIGS. 8(A) to 8(C), the rotation torsional axis of mirror mechanism 2250-1 causes mirror 212 to rotate about a diagonal axis relative to the x-y coordinates of the DLP chip housing. This diagonal tilting requires that the incident light portions received from the spatial light modulator in an imaging system be projected onto each mirror mechanism 225 at a compound incident angle so that the exit angle of the light is perpendicular to the surface of the DLP chip. This requirement complicates the side by side placement of imaging systems.

Figure 9:
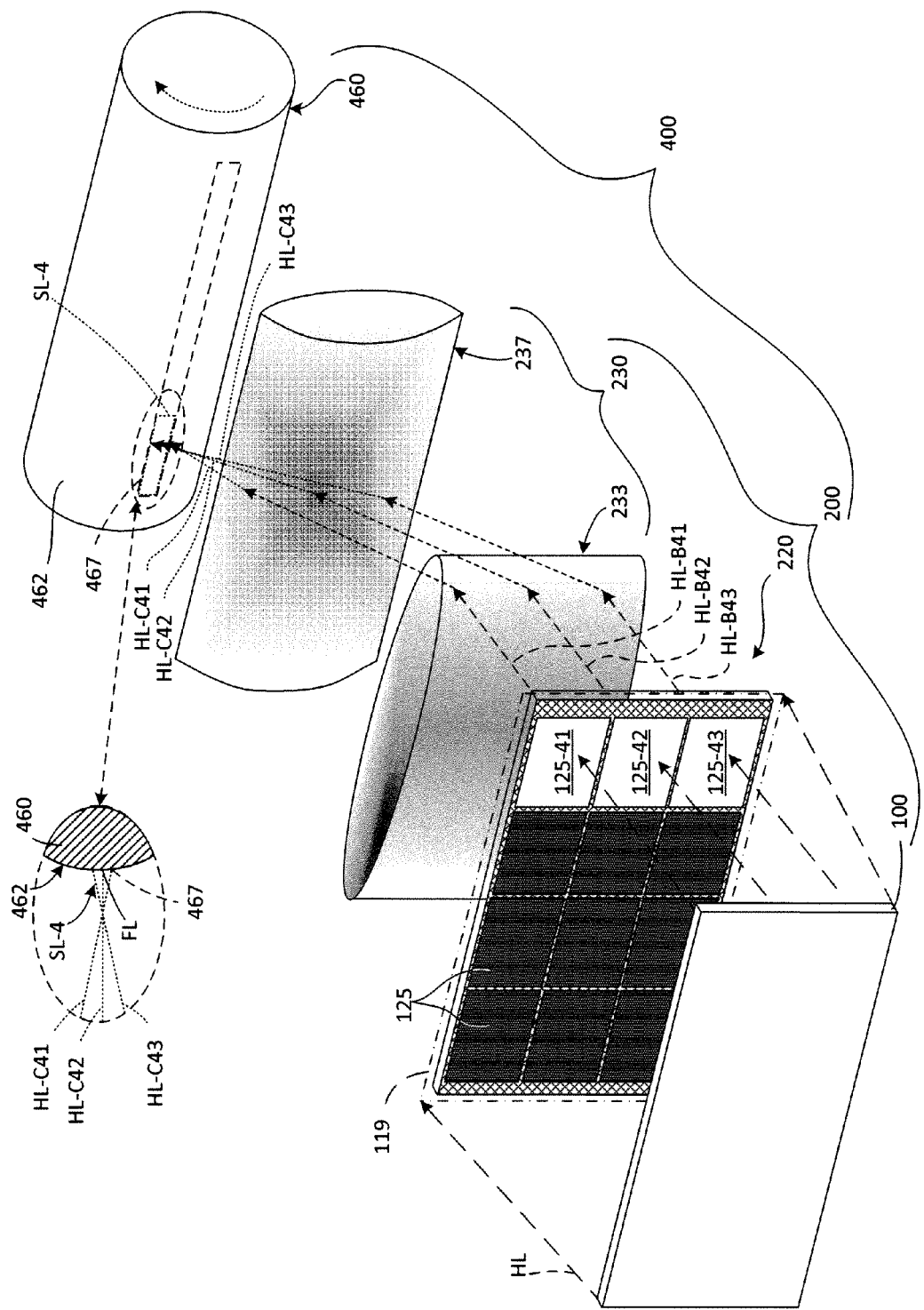
FIG. 9 is a perspective view showing a simplified scanning/printing apparatus according to another specific embodiment of the present invention.
Figure 10:
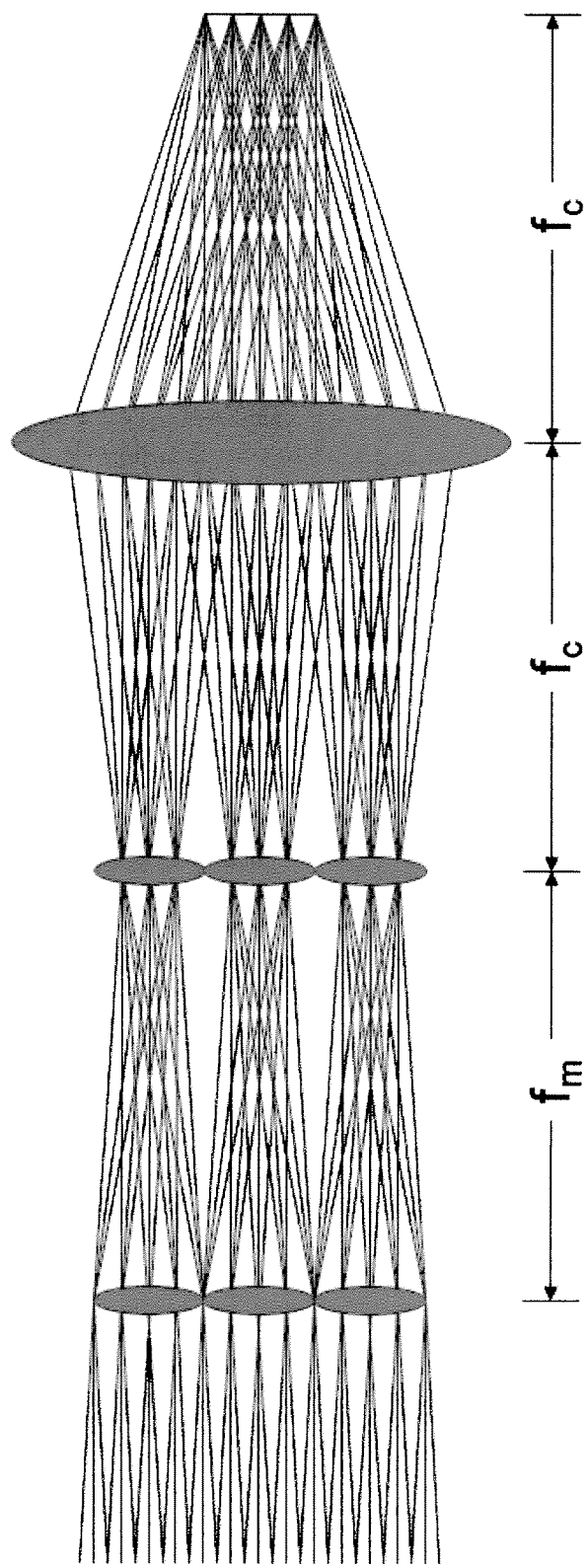
FIG. 10 is a simplified diagram depicting a conventional multiple aperture beam integration optical system.

FIG. 9 is a simplified perspective view showing a scanning/printing apparatus 400 that includes single-pass imaging system 200 and a scan structure (e.g., an imaging drum cylinder) 460 according to another embodiment of the present invention. As described above, imaging system 200 generally includes laser line generator system 100 for generating a homogenous light field HL, a spatial light modulator 220, and an anamorphic optical (e.g., projection lens) system 230 that function essentially as set forth above. Referring to upper right portion of FIG. 9, imaging drum cylinder (roller) 460 is positioned relative to image system 200 such that anamorphic optical system 230 images and concentrates the modulated light portions received from spatial light modulator 220 onto an imaging surface 462 of imaging drum cylinder 460, and in particular into an imaging region 467 of imaging surface 462, using a cross-process optical subsystem 233 and a process-direction optical subsystem 237 that collectively form anamorphic optical system 230. In the illustrated embodiment, cross-process optical subsystem 233 acts to horizontally invert the light passed through spatial light modulator 220 (i.e., such that modulated light portions HL-B41, HL-B42 and HL-B43 are directed from the right side of cross-process optical subsystem 233 toward the left side of imaging region 467). In addition, in alternative embodiments, imaging drum cylinder 460 is either positioned such that imaging surface 462 coincides with the scan (or focal) line defined by anamorphic optical system 230, whereby the concentrated light portions (e.g., concentrated light portions HL-C41, HL-C42 and HL-C43) concentrate to form a single one-dimensional spot (light pixel) SL-4 in an associated portion of imaging region 467, or such that imaging surface 462 is coincident with the focal line defined by anamorphic optical system 230, whereby the light portions form a swath containing a few imaging lines (i.e., such that the light sub-pixel formed by light portion HL-C41 is separated from the light sub-pixel formed by light portion HL-C43. In a presently preferred embodiment, as indicated by the dashed-line bubble in the upper right portion of FIG. 9, which shows a side view of imaging drum cylinder 460, imaging surface 462 is set at the focal line FL location such that the image generated at scan line SL-4 by beams HL-C41, HL-C42 and HL-C43 is inverted in the fashion indicated in the dashed-line bubble. Additional details regarding apparatus 400 are described in co-owned U.S. Pat. No. 8,405,913, entitled ANAMORPHIC PROJECTION OPTICAL SYSTEM, which is incorporated herein by reference in its entirety.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A laser line generator system for generating an elongated homogenous line illumination pattern on an illumination plane, the system comprising:
   a plurality of diode lasers, each diode laser configured to emit coherent light having a slow-axis that is aligned in a slow-axis direction; and
   an optical system including:
      a light guide positioned to receive said coherent light generated by said plurality of diode lasers, said light guide comprising a optically transparent dielectric material including side walls configured such that the side walls cause total internal reflection of said coherent light propagating through the optically transparent dielectric material, whereby said coherent light is mixed such that substantially homogenous light having intensity variations of less than 10% exits said light guide;
      at least one slow-axis relay lens positioned between the light guide and the illumination plane and configured to image said homogenized light exiting said light guide such that the homogenous light forms said homogenous line illumination pattern with an elongated line width extending in the slow-axis direction on said illumination plane.

2. A laser line generator system for generating an elongated homogenous line illumination pattern on an illumination plane, the system comprising:
   a plurality of diode lasers, each diode laser configured to emit coherent light having a slow-axis that is aligned in a slow-axis direction; and
   an optical system including:
      a light guide positioned to receive said coherent light generated by said plurality of diode lasers, and configured to mix said coherent light such that substantially homogenous light exits said light guide; and
      at least one slow-axis relay lens positioned between the light guide and the illumination plane and configured to image said homogenized light exiting said light guide such that the homogenous light forms said homogenous line illumination pattern with an elongated line width extending in the slow-axis direction on said illumination plane,
   wherein said plurality of laser diodes are integrally disposed on a laser diode bar and aligned in said slow-axis direction, and
   wherein said light guide comprises an optically transparent dielectric material forming an integral solid structure including a planar entrance face positioned to receive said coherent light generated by said plurality of laser diodes, a planar exit face, and opposing planar side walls extending between the entrance face and the exit face, said opposing side walls being configured to generate total internal reflection of said coherent laser light as said coherent light propagates through said light guide, whereby said coherent light is converted to homogenous light before exiting through the exit face.

3. The laser line generator system of claim 2, wherein said laser diode bar comprises at least twenty said laser diodes that are disposed in an arrangement comprising a fill factor that is greater than 40%.

4. The laser line generator system of claim 3, wherein a first width of said entrance face in said slow-axis direction is equal to or greater than a second width of said exit face in said slow-axis direction.

5. The laser line generator system of claim 4, wherein said opposing planar side walls of said light guide comprise a down-taper of 2-to-1 or greater.

6. A laser line generator system for generating an elongated homogenous line illumination pattern on an illumination plane, the system comprising:
   a plurality of diode lasers, each diode laser configured to emit coherent light having a slow-axis that is aligned in a slow-axis direction; and
   an optical system including:
      a light guide positioned to receive said coherent light generated by said plurality of diode lasers, and configured to mix said coherent light such that substantially homogenous light exits said light guide; and
      at least one slow-axis relay lens positioned between the light guide and the illumination plane and configured to image said homogenized light exiting said light guide such that the homogenous light forms said homogenous line illumination pattern with an elongated line width extending in the slow-axis direction on said illumination plane,
   wherein said at least one slow-axis relay lens comprises a Keplerian telescope including a first slow-axis lens and a second slow-axis lens configured and arranged to project the homogenized light exiting the light guide onto the illumination plane, thereby generating said line illumination pattern.

7. The laser line generator system of claim 6, wherein each of the first and second slow-axis lenses comprises a cylinder lens with at least one acylindrical surface.

8. The laser line generator system of claim 7,
   wherein said light guide comprises a planar exit face having an exit width aligned in the slow-axis direction,
   wherein said first slow-axis lens has a first focal length and said second slow-axis lens has a second focal length, and
   wherein the Keplerian telescope is positioned and arranged such that the line illumination pattern has a line width in the slow-axis direction is equal to the exit width multiplied by the second focal length divided by the first focal length.

9. The laser line generator system of claim 7,
   wherein said light guide comprises a down-taper of at least 2-to-1,
   wherein said Keplerian telescope is configured such that a ratio of said second focal length divided by said first focal length is greater than two, and
   wherein said plurality of diode lasers plurality of diode lasers comprise Aluminum Indium Gallium Arsenide Phosphide configured to generate said coherent light having a wavelength in the range of 976 nm and 1020 nm.

10. The laser line generator system of claim 7, wherein each of the first and second slow-axis lenses comprises an acylindrical lens.

11. The laser line generator optical system of claim 1, further comprising a fast-axis (FA) lens disposed between the plurality of laser diodes and the light guide and configured such that said coherent light is collimated in the fast-axis direction before entering said light guide.

12. The laser line generator optical system of claim 11, a second fast-axis (FA) lens disposed between said at least one slow-axis relay lens and said illumination plane.

13. A single-pass imaging system comprising:
a plurality of diode lasers, each diode laser configured to emit coherent light having a slow-axis that is aligned in a slow-axis direction; and
a first optical system including:
a light guide positioned to receive said coherent light generated by said plurality of diode lasers, and configured to mix said coherent light such that substantially homogenous light exits said light guide;
at least one slow-axis relay lens positioned to receive said substantially homogenous light, and configured to image said homogenized light exiting said light guide such that the substantially homogenous light forms a line illumination pattern with an elongated line width extending in the slow-axis direction;
a spatial light modulator including:
a plurality of light modulating elements arranged in a two-dimensional array and disposed such that each said modulating element receives an associated portion of the line image pattern, and
a controller for individually controlling the plurality of modulating elements such that each modulating element is adjustable, in response to an associated control signal generated by the controller, between a first modulated state and a second modulated state, whereby when said each modulating element is in said first modulated state, said each modulating element modulates an associated received homogenous light portion such that an associated modulated light portion is directed in a corresponding predetermined direction, and when said each modulating element is in said second modulated state, said each modulating element modulates the associated received homogenous light portion such that the associated modulated light portion is prevented from passing along said corresponding predetermined direction; and
a second optical system positioned to receive said modulated light portions from said each modulating element disposed in said first modulated state, and arranged to concentrate said modulated light portions such that the concentrated modulated light portions produce an elongated scan line image.

14. The imaging system according to claim 13,
wherein said plurality of laser diodes comprises at least twenty said laser diodes integrally disposed and aligned in said slow-axis direction in an arrangement comprising a fill factor that is greater than 40%, and
wherein said light guide comprises an optically transparent dielectric material forming an integral solid structure including a planar entrance face positioned to receive said coherent light generated by said plurality of laser diodes, a planar exit face, and opposing planar side walls extending between the entrance face and the exit face, said opposing side walls being configured to generate total internal reflection of said coherent laser light as said coherent light propagates through said light guide.

15. The imaging system according to claim 13,
wherein the plurality of light modulating elements are arranged in a plurality of rows and a plurality of columns, wherein each said column includes an associated group of said plurality of light modulating elements, and
wherein the second optical system is arranged to concentrate modulated light portions received from each associated group of said plurality of light modulating elements of each said column onto an associated scan line portion of said elongated scan line image.

16. The imaging system according to claim 15, wherein the spatial light modulator comprises one of a digital micromirror device, an electro-optic diffractive modulator array, and an array of thermo-optic absorber elements.

17. The imaging system according to claim 13,
wherein each of the plurality of light modulating elements comprises a microelectromechanical (MEMs) mirror mechanism disposed on a substrate, and
wherein each MEMs mirror mechanism includes a mirror and means for supporting and moving the mirror between a first tilted position relative to the substrate, and a second tilted position relative to the substrate, according to said associated control signals generated by the controller.

18. The imaging system according to claim 17, wherein the laser line generator, the spatial light modulator and the optical system are positioned such that, when the mirror of each said MEMs mirror mechanism is in the first tilted position, said mirror reflects an associated received homogenous light portion such that said modulated light portion is directed to the second optical system, and when said mirror of each said MEMs mirror mechanism is in the second tilted position, said mirror reflects said associated received homogenous light portion such that said reflected received homogenous light portion is directed away from the second optical system.

19. The imaging system according to claim 18, further comprising a heat sink fixedly positioned relative to the spatial light modulator such that when said mirror of each said MEMs mirror mechanism is in the second tilted position, said reflected received homogenous light portion is directed onto said heat sink.

20. An apparatus comprising:
a single-pass imaging system including:
a laser diode bar including a plurality of diode lasers, each diode laser configured to emit coherent light having a slow-axis that is aligned in a slow-axis direction; and
a first optical system including:
a light guide positioned to receive said coherent light generated by said plurality of diode lasers, and configured to mix said coherent light such that substantially homogenous light exits said light guide; and
at least one slow-axis relay lens positioned to receive said substantially homogenous light, and configured to image said homogenized light exiting said light guide such that the substantially homogenous light forms a line illumination pattern with an elongated line width extending in the slow-axis direction;
a spatial light modulator including:
a plurality of light modulating elements arranged in a two-dimensional array and disposed such that each said modulating element receives an associated portion of the homogenous line image pattern, and
a controller for individually controlling the plurality of modulating elements such that each modulating element is adjustable, in response to an associated control signal generated by the controller, between a first modulated state and a second modulated state, whereby when said each modulating element is in said first modulated state, said each modulating element generates an associated modulated light portion by directing said associated received homogenous light portion in a corresponding predetermined direction, and when said each modulating element is in said second modulated state, said associated received homogenous light portion is prevented from passing along said corresponding predetermined direction by said each modulating element; and an anamorphic optical system positioned to receive said modulated light portions from said each modulating element disposed in said first modulated state, and arranged to concentrate said modulated light portions such that the concentrated modulated light portions produce an elongated scan line image; and a scan structure positioned relative to the single-pass imaging system such that the elongated scan line image produced by the anamorphic optical system is disposed on an imaging region defined on an imaging surface of said scan structure.

\* \* \* \* \*